US009393775B2

(12) United States Patent
Uchida et al.

(10) Patent No.: US 9,393,775 B2
(45) Date of Patent: Jul. 19, 2016

(54) SCREEN PRINTING MACHINE AND SCREEN PRINTING METHOD

(71) Applicant: PANASONIC INTELLECTUAL PROPERTY MANAGEMENT CO., LTD., Osaka (JP)

(72) Inventors: Hideki Uchida, Yamanashi (JP); Masaaki Tokunaga, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 15 days.

(21) Appl. No.: 14/638,436

(22) Filed: Mar. 4, 2015

(65) Prior Publication Data

US 2015/0258774 A1 Sep. 17, 2015

(30) Foreign Application Priority Data

Mar. 17, 2014 (JP) ................. 2014-053062

(51) Int. Cl.
| | |
|---|---|
| *B41F 15/40* | (2006.01) |
| *B41F 15/44* | (2006.01) |
| *H05K 3/12* | (2006.01) |
| *B41F 15/42* | (2006.01) |
| *H05K 3/34* | (2006.01) |

(52) U.S. Cl.
CPC ............... *B41F 15/44* (2013.01); *B41F 15/40* (2013.01); *B41F 15/42* (2013.01); *H05K 3/1233* (2013.01); *H05K 3/3484* (2013.01); *B41P 2215/50* (2013.01)

(58) Field of Classification Search
CPC ........ B41F 15/40; B41F 15/44; B41F 31/022; B41F 15/42; B41F 15/0813; B41P 2215/50; H05K 3/1233; H05K 3/3484
USPC ........................................................ 101/366
See application file for complete search history.

(56) References Cited

U.S. PATENT DOCUMENTS

| | | | | | |
|---|---|---|---|---|---|
| 3,153,815 | A | * | 10/1964 | Seidl ................. | B29C 45/0005 222/342 |
| 4,535,693 | A | * | 8/1985 | Belvederi ........... | B05C 11/10 101/366 |
| 4,622,239 | A | * | 11/1986 | Schoenthaler ...... | B23K 3/06 118/406 |
| 4,808,435 | A | * | 2/1989 | Cropp ................ | B41M 1/12 427/272 |

(Continued)

FOREIGN PATENT DOCUMENTS

| | | | | | |
|---|---|---|---|---|---|
| JP | 61171565 | A | * | 8/1986 | ............. B05C 5/00 |
| JP | 08207243 | A | * | 8/1996 | ............. B41F 15/40 |
| JP | 2010-172928 | A | | 8/2010 | |

*Primary Examiner* — Blake A Tankersley
*Assistant Examiner* — Marissa Ferguson Samreth
(74) *Attorney, Agent, or Firm* — Pearne & Gordon LLP

(57) ABSTRACT

A screen printing machine includes a paste supply apparatus which supplies paste on a mask by using a paste pot including an inner lid movable in a container. The paste supply apparatus includes: a pot holder which holds the paste pot such that a through hole of the container faces downward; an ejecting member which abuts on the inner lid of the paste pot; an ejecting member lifting unit which presses down the ejecting member to eject the paste from the through hole; and a detector which detects a state in which the ejecting member reaches a predetermined press-down limit position in the container. After the detector detects the state in which the ejecting member reaches the press-down limit position in the container, the ejecting member lifting unit continues to press down the ejecting member to further eject the paste.

3 Claims, 7 Drawing Sheets

(56) References Cited

U.S. PATENT DOCUMENTS

| | | | | |
|---|---|---|---|---|
| 5,878,667 | A * | 3/1999 | Ryan | B41F 31/022 101/366 |
| 5,974,971 | A * | 11/1999 | Moller | B41F 31/02 101/366 |
| 6,216,589 | B1 * | 4/2001 | Tani | B41F 15/40 101/123 |
| 6,516,721 | B1 * | 2/2003 | Voge | B41F 35/04 101/365 |
| 6,615,715 | B2 * | 9/2003 | Abe | B41F 15/40 101/123 |
| 2004/0187716 | A1 * | 9/2004 | Pham-Van-Diep | B41F 15/42 101/123 |
| 2004/0244612 | A1 * | 12/2004 | Willshere | B23K 3/0638 101/123 |
| 2007/0240595 | A1 * | 10/2007 | Nagel | B41F 31/08 101/366 |
| 2009/0294483 | A1 * | 12/2009 | Kim | B41F 15/40 222/386 |

* cited by examiner

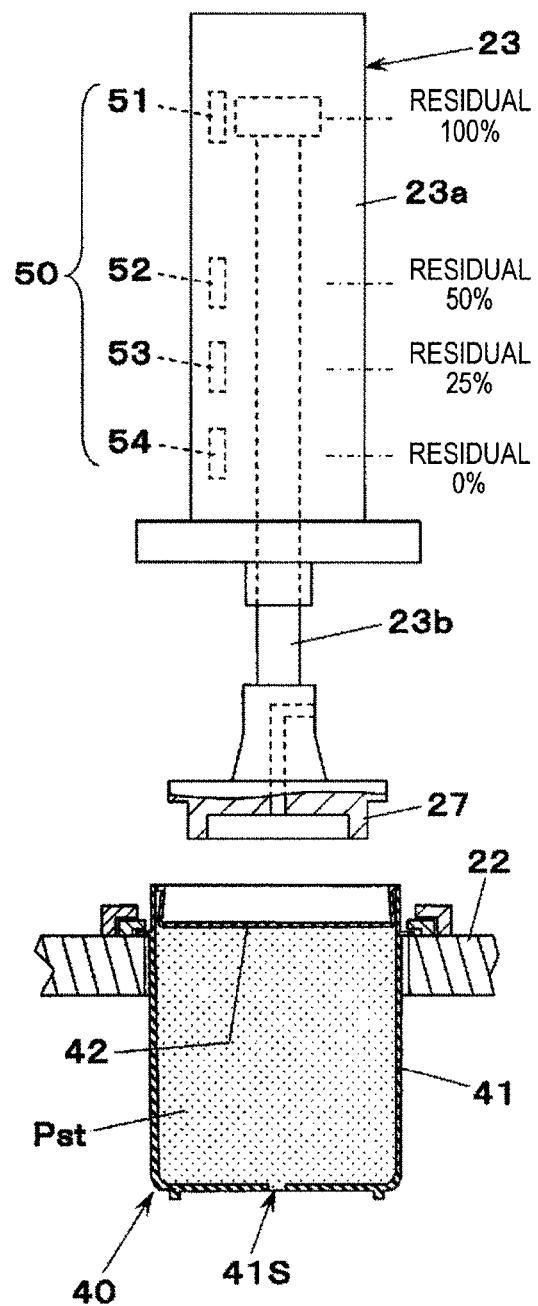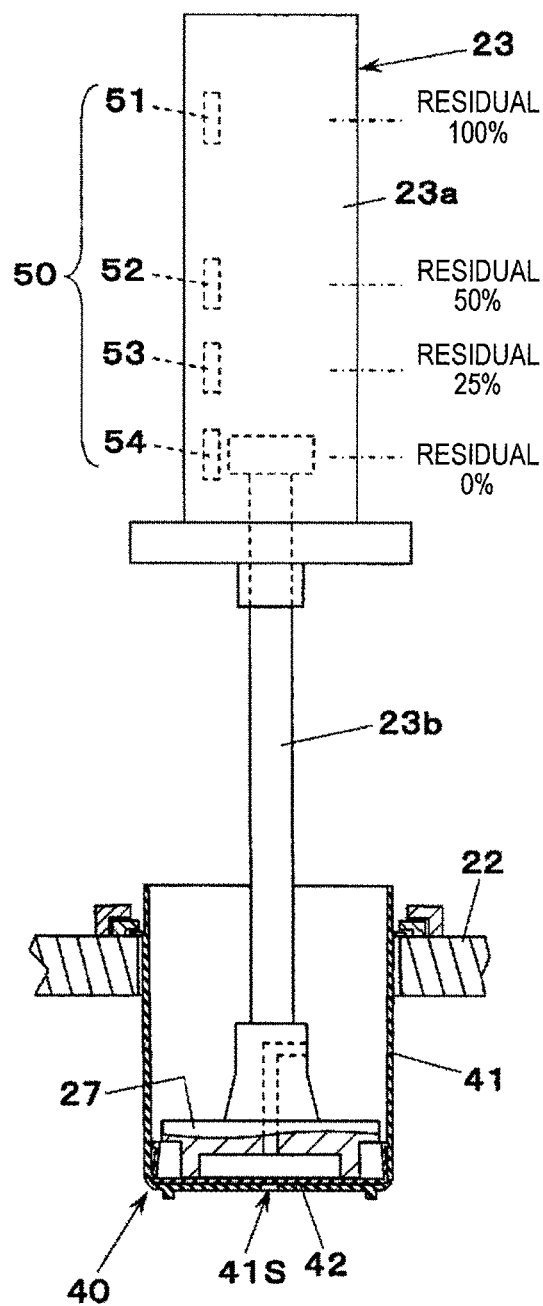

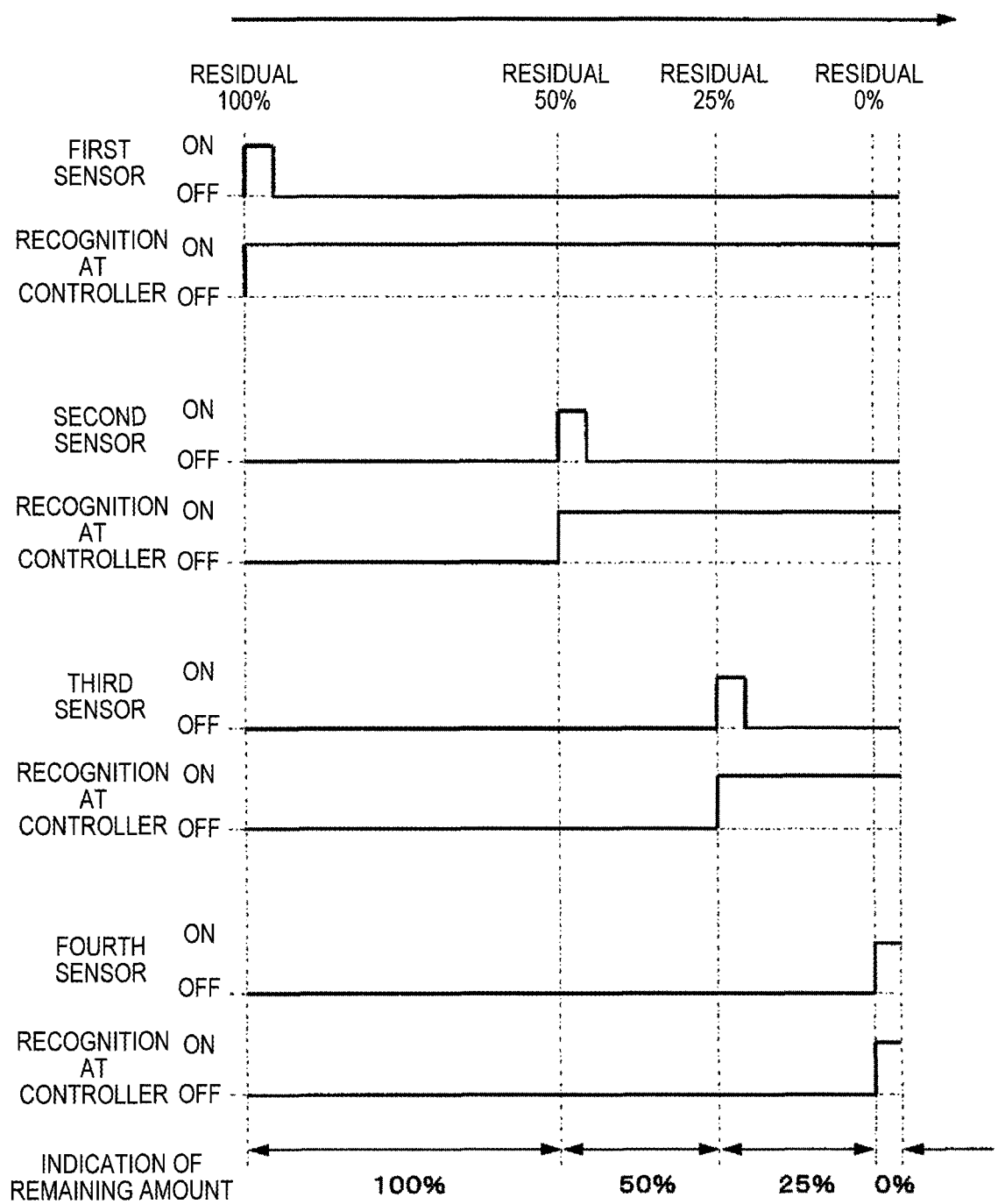

SCREEN PRINTING MACHINE AND SCREEN PRINTING METHOD

BACKGROUND

1. Technical Field

One or more embodiments of the present invention relate to a screen printing machine including a paste supply apparatus which ejects and supply paste on a mask from a paste pot, and a screen printing method.

2. Background Art

JP-A-2010-172928 describes a paste supply apparatus which supplies paste on a mask for a screen printing. The past supply apparatus ejects and supplies the past directly from a commercially-available paste pot which stores the paste in a tubular container. In the paste supply apparatus, the paste pot is held such that a through hole formed in a bottom portion of the container faces downward, and the paste is directly ejected by using an ejecting member. In the above-described type of the paste supply apparatus which directly ejects the paste by the ejecting member, attachment of the ejecting member so as to firmly contact an inner wall of the container requires time and effort. Therefore, there is another type of the paste supply apparatus which causes the ejecting member to press down an inner lid.

In the paste supply apparatus of this type, after the paste in the container is used up, exchange of the empty paste pot for a new paste pot is required. For this reason, the paste supply apparatus may be provided with a detector which detects a state in which the ejecting member reaches a predetermined pressing-down limit position in the container, and when the detector detects the state in which the ejecting member reaches the pressing-down limit position in the container, the ejecting member is pulled upward out from the container so as to exchange the paste pot.

SUMMARY

However, since the viscosity of the paste is high, even when the detector detects the state in which the ejecting member reaches the predetermined pressing-down limit position in the container, the paste in fact is not often completely ejected from the container, the paste pot is exchanged for a new one while the paste remains in the container, whereby waste paste is generated.

An object of one or more embodiments of the present invention is to provide a screen printing machine and a screen printing method which can reduce waste paste generated by remaining in a container.

In one or more embodiments of the present invention, there is provided a screen printing machine including: a mask; a paste supply apparatus which supplies paste on the mask by using a paste pot including a tubular container which stores the paste and which includes a bottom portion having a through hole and an inner lid movable in the container; a squeegee slidable on the mask on which the paste is supplied by the paste supply apparatus, wherein the paste supply apparatus includes: a pot holder which holds the paste pot such that the through hole faces downward; an ejecting member which abuts on the inner lid of the paste pot held by the pot holder; an ejecting member lifting unit which presses down the ejecting member abutting on the inner lid in the container to eject the paste from the through hole; and a detector which detects a state in which the ejecting member reaches a predetermined press-down limit position in the container, and wherein after the detector detects the state in which the ejecting member reaches the press-down limit position in the container, the ejecting member lifting unit continues to press down the ejecting member to further eject the paste in the container.

In one or more embodiments of the present invention, there is provided a screen printing method by a screen printing machine, the screen printing machine including: a mask; a paste supply apparatus which supplies paste by using a paste pot including a tubular container which stores the paste and which includes a bottom portion having a through hole and an inner lid movable in the container; and a squeegee slidable on the mask, said screen printing method including: supplying the paste on the mask by ejecting the paste from the through hole by pressing down an ejecting member in the container, the ejecting member abutting on the inner lid of the paste pot held in a state in which the through hole faces downward; and printing the paste on a board via the mask by moving the squeegee to slide on the mask on which the ejected paste is supplied, wherein during the supply of the paste, after the ejecting member reaches a predetermined press-down limit position in the container, pressing down of the ejecting member is continued to further eject the paste in the container.

According to one or more embodiments of the present invention, waste paste generated by remaining in the container can be reduced.

BRIEF DESCRIPTION OF THE DRAWINGS

FIGS. 6A and 6B show an arrangement of a position detection sensor provided in a pressing cylinder of the paste supply apparatus according to the embodiment of the present invention; and FIG. 7 shows an ON/OFF state of the position detection sensor and a signal recognition state of a controller with respect to a position of the ejecting member provided in the paste supply apparatus according to the embodiment of the present invention.

DETAILED DESCRIPTION

Figure 1:
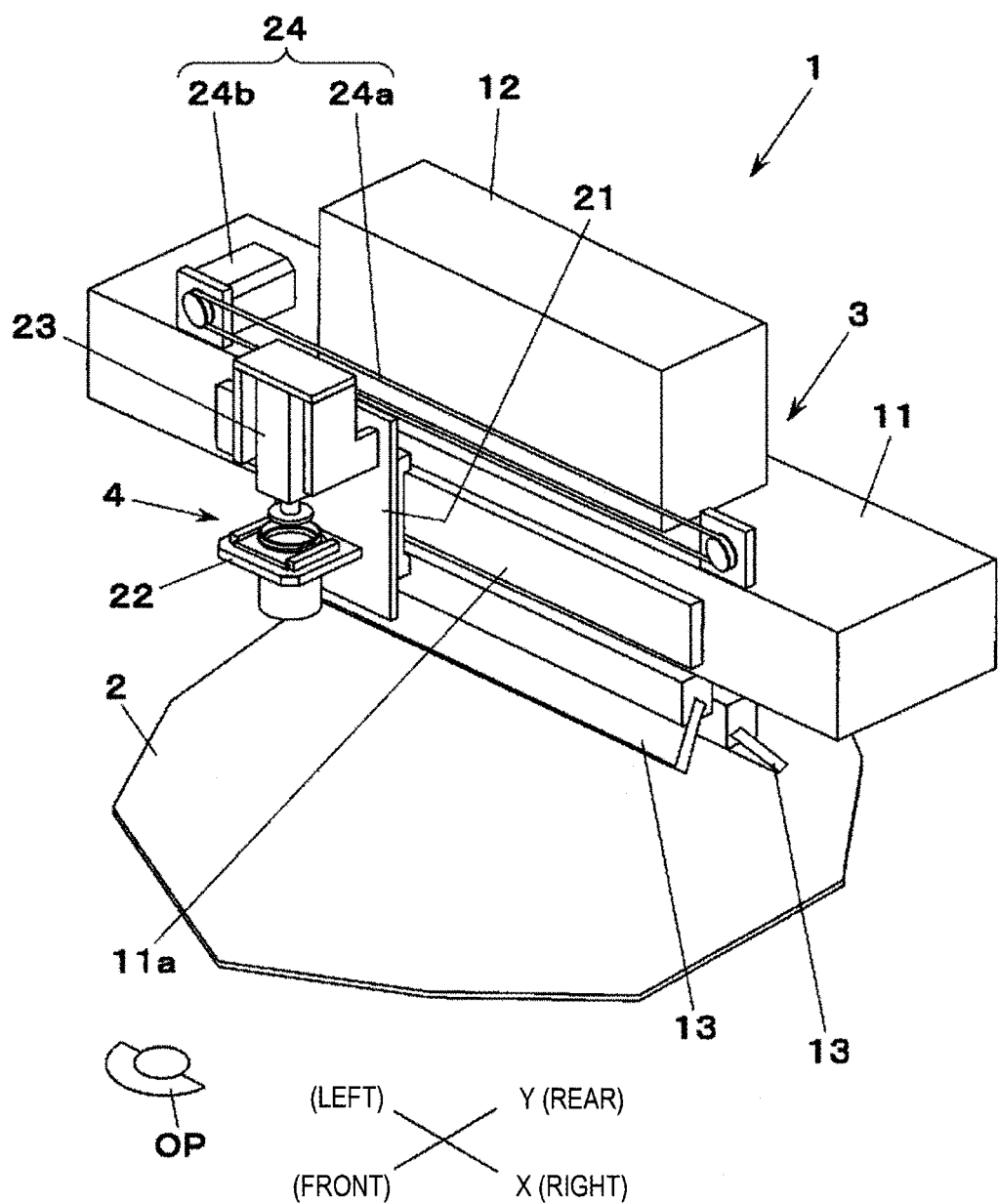
FIG. 1 is a perspective view of a screen printing machine according to an embodiment of the present invention.

One or more embodiments of the present invention will be described with reference to the drawings. FIG. 1 shows a screen printing machine 1 which is a machine for screen-printing paste such as solder paste on a board (not shown) and which includes a mask 2 having pattern holes corresponding to positions of electrodes of the board, a print head 3 provided above the mask 2, and a paste supply apparatus 4 provided in the print head 3.

As shown in FIG. 1, the print head 3 includes: a movable base 11 which is moved in a front-rear direction viewed from an operator OP (hereinafter also referred to as a Y-axis direction) by a head moving mechanism (not shown); a squeegee lifting mechanism 12 provided on an upper surface of the movable base 11; two squeegees 13 which are provided below the movable base 11 and individually moved up and down by the squeegee lifting mechanism 12. The squeegees 13 extend in a right-left direction viewed from the operator OP (hereinafter also referred to as an X-axis direction, and oppose each other in the Y-axis direction.

Figure 2:
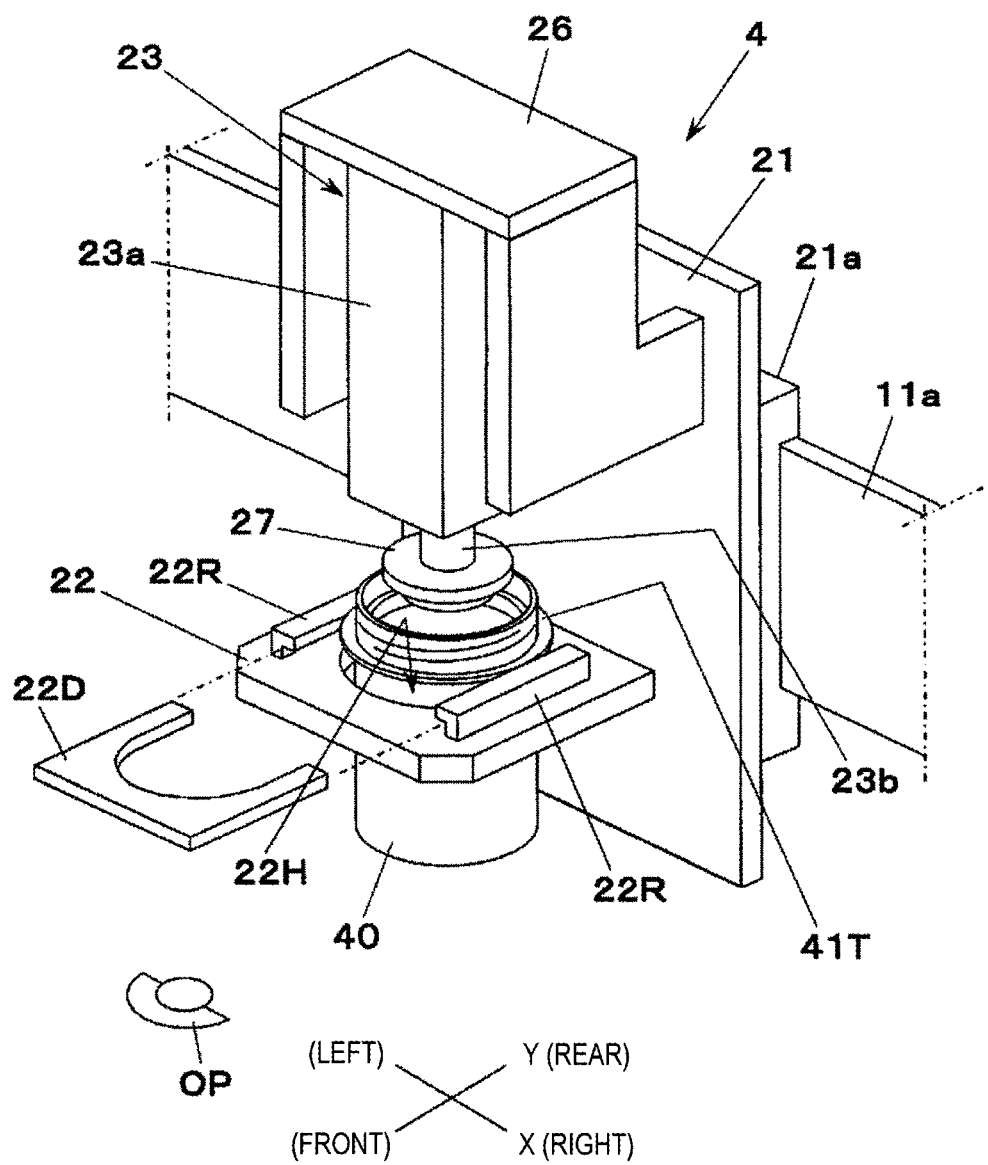
FIG. 2 is a perspective view of a paste supply apparatus provided in the screen printing machine according to the embodiment of the present invention.

As shown in FIGS. 1 and 2, the paste supply apparatus 4 includes: a base member 21; a pot holder 22 provided on a front surface (opposing the operator OP) of the base member 21; and a pressing cylinder 23 provided on the front surface of the base member 21. On a front surface of the movable base 11, a first guide 11a is provided to extend in the X-axis direction. A first slider 21a is provided on a rear surface side of the base member 21, and is slidably attached to the first guide 11a.

As shown in FIG. 1, a belt driving mechanism 24 is provided on the movable base 11, and includes a timing belt 24a spanned to extend in the X-axis direction; and a motor 24b which drives the timing belt 24a. The rear surface of the base member 21 is coupled to the timing belt 24a. When the motor 24b drives the timing belt 24a, the base member 21 (i.e., the paste supply apparatus 4) moves along the X-axis direction in front of the movable base 11.

As shown in FIG. 2, the pot holder 22 is formed of a plate member provided to extend in a horizontal direction, and includes a pot insertion hole 22H in a center portion thereof. The pot insertion hole 22H allows a paste pot 40 to be inserted therein. On an upper region of the front surface of the base member 21, a bracket 26 is provided. A cylinder tube 23a of the pressing cylinder 23 is attached to the bracket 26. The pressing cylinder 23 is provided such that a piston rod 23b faces downward, and an ejecting member 27a is attached to a lower end of the piston rod 23b. The ejecting member has a disk shape (or cylindrical shape) of a diameter smaller than an inner diameter of a container 41 of the the paste pot 40.

Figure 3:
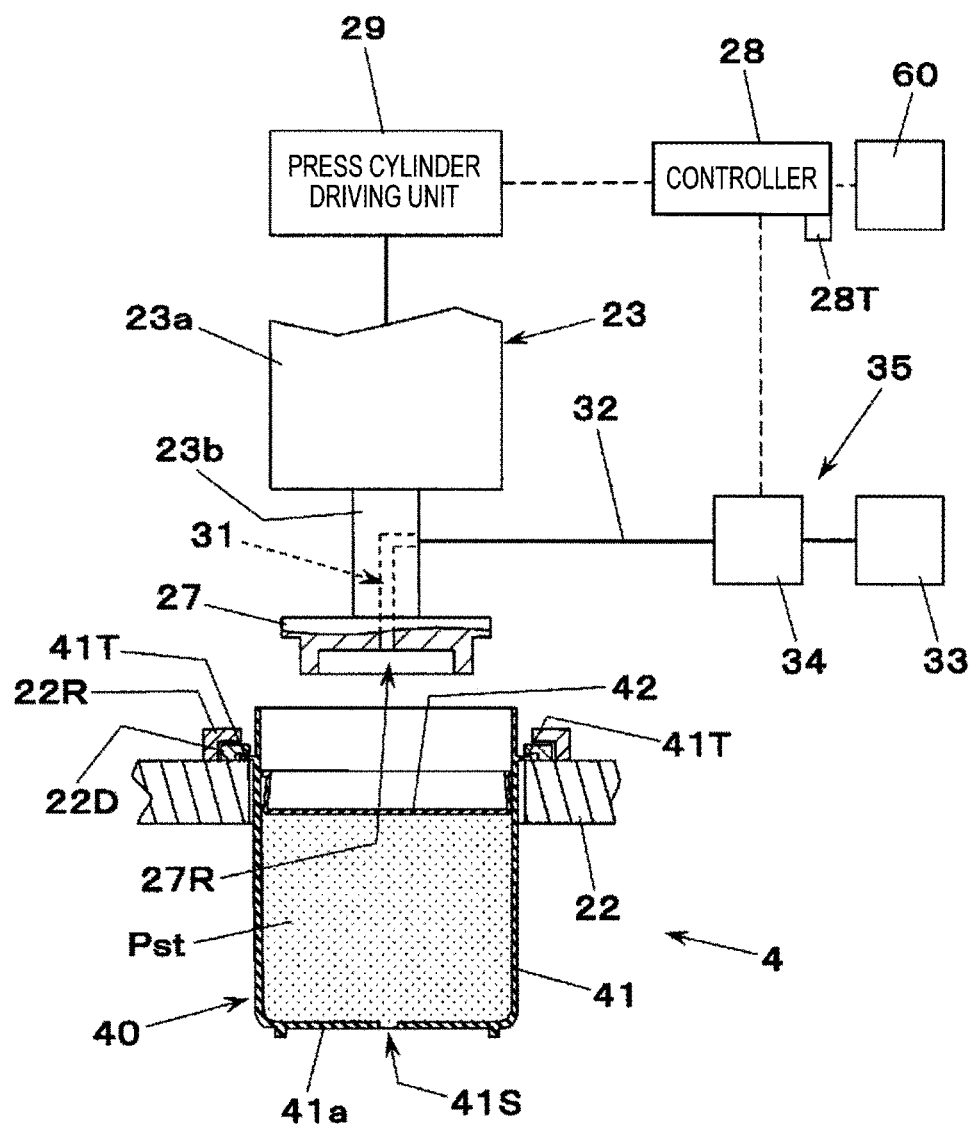
FIG. 3 is a diagram showing a control system of the paste supply apparatus according to the embodiment of the present invention.

As shown in FIG. 3, the screen printing machine 1 includes a controller 28 which controls a pressing cylinder driving unit 29. The pressing cylinder 23 is driven by the pressing cylinder driving unit 29 to pull and push the piston rod 23b, whereby the ejecting member 27 moves up and down. In other words, the pressing cylinder 23 serves as an example of an ejecting member lifting unit which moves up and down the ejecting member 27.

As shown in FIG. 3, in an inside of the ejecting member 27 and the piston rod 23b, a suction path 31 is formed. The suction path 31 connects an opening portion 27R opened at the lower surface of the ejecting member 27 with a negative pressure generator 33 via a pipe 32 extending in an outside of the piston rod 23b, and a valve 34 is interposed into the pipe 32. When the valve 34 is operated by the controller 28 in a state in which the negative pressure generator 33 generates negative pressure, vacuum pressure is supplied to the opening portion 27R via the pipe 32 and the suction path 31, and suction power is generated at the lower surface of the ejecting member 27. In other words, the suction path 31, the pipe 32, the negative pressure generator 33, and the valve 34 form a suction power generating mechanism 35 which generates the suction power at the lower surface of the ejecting member 27.

Figure 4A:
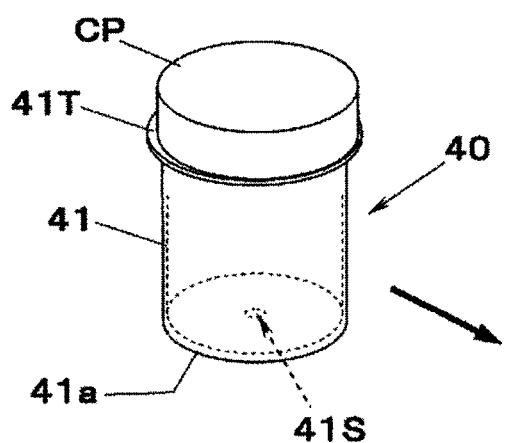
FIGS. 4A to 4C are partial cross-sectional views of a paste pot used for the paste supply apparatus according to the embodiment of the present invention.
Figure 4B:
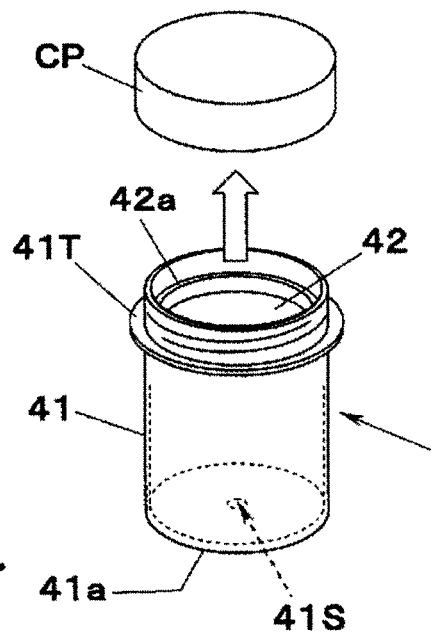
Figure 4C:
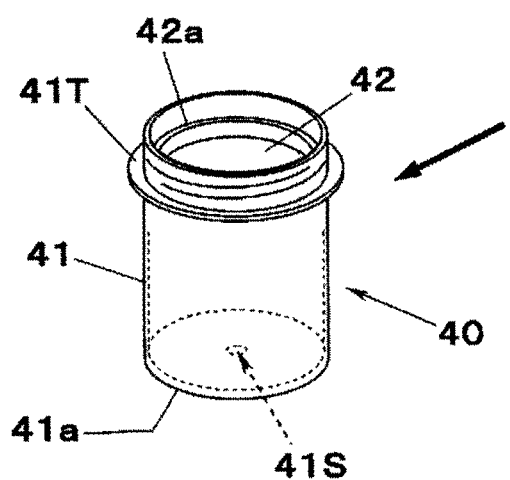

As shown in FIG. 4A to 4C, the paste pot 40 includes: the tubular container 41 which stores the paste Pst; and an inner lid 42 provided in the container 41, and a bottom portion 41a of the container 41 has a through hole 41S formed therein. An outer edge of the inner lid 42 is bent upward to form a bent portion 42a, and the bent portion 42a firmly contacts an inner wall of the container 41. The inner lid 42 is movable in the container 41 in the up-down direction. The paste pot 40 is placed to the pot holder 22 by removing a cap CP attached to an open end of the container 41 (from FIG. 4A to FIG. 4B), and thereafter setting a posture of the paste pot 40 such that the the the through hole 41S faces downward (FIG. 4C), and inserting the paste pot into the pot insertion hole 22H such that a flange portion 41T provided on a side surface of the container 41 abuts on an edge portion the pot insertion hole 22H from above.

As shown in FIG. 2, the pot insertion hole 22H is sandwiched between a pair fixture holding members 22R from outside in the X-axis direction. When a pot fixture 22D is inserted, from front, the pair of fixture holding members 22R, the flange portion 41T of the paste pot 40 abutting on the edge portion of the pot insertion hole 22H is held by the pot fixture 22D from above, and the paste pot 40 is held by the pot holder 22 in a state in which the movement in the up-down direction is regulated.

Figure 5A:
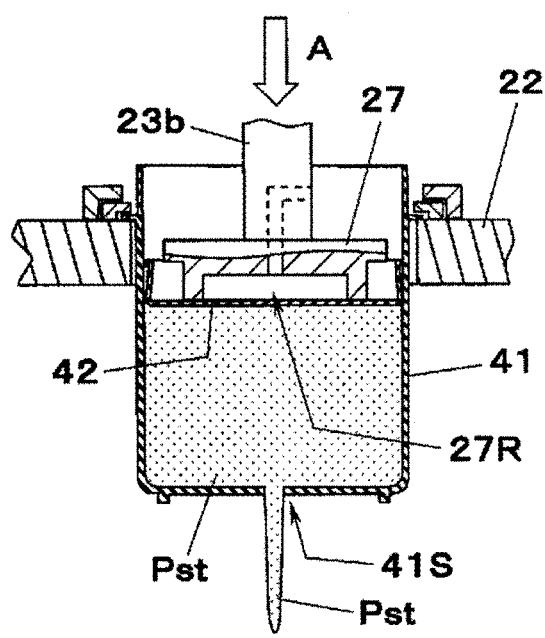
FIGS. 5A and 5B are operation diagrams of the paste supply apparatus according to the embodiment of the present invention.

Supply of the paste Pst of the paste supply apparatus 4 is performed by controlling the pressing cylinder 23 and the suction power generating mechanism 35 by the controller 28. When the controller 28 outputs a paste ejection command signal, the pressing cylinder 23 starts pushing operation of the piston rod 23b to move down the ejecting member 27. The pressing cylinder 23 continues the pushing operation such that the lower surface of the ejecting member 27 which is moved down abuts on an upper surface of the inner lid 42 of the paste pot 40 held by the pot holder 22, and further presses down the inner lid 42 in the container 41 (FIG. 5A: an arrow A), thereby ejecting the paste Pst from the through hole 41S. In a state in which the ejecting member 27 abuts on the inner lid 42, the suction power generating mechanism 35 supplies the vacuum pressure in the opening portion 27R opened in the lower surface of the ejecting member 27 so as to generate the suction power, whereby the inner lid 42 is sucked and held by the ejecting member 27.

Figure 5B:
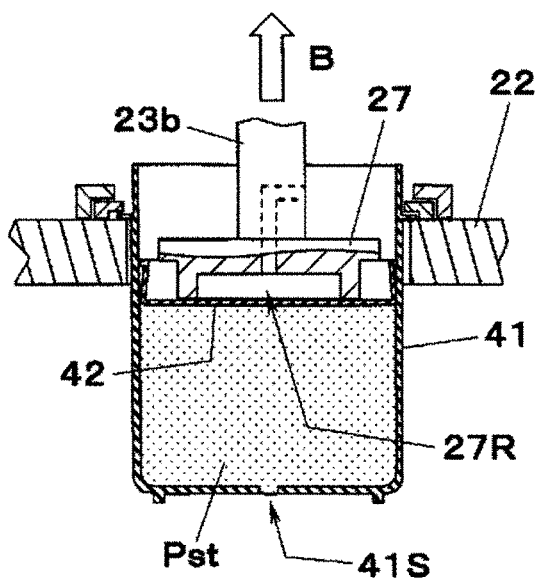

When a prescribed amount of the paste Pst is ejected from the container 41 by moving down the inner lid 42 by the pressing cylinder 23, the controller 28 stops outputting the paste ejection signal. Thereafter, the pressing cylinder 23 switches the operation of the piston rod 23b from the pushing operation to the pulling operation (FIG. 5B: an arrow B), and moves up the ejecting member 27 to lift the inner lid 42 by a predetermined length. By the lifting of the inner lid 42, the negative pressure is generated in the container 41, and the paste Pst in the vicinity of the through hole 41S is taken up into the container 41, whereby drop of the paste Pst from the through hole 41S is prevented.

As shown in FIGS. 6A and 6B, a position detection sensor 50 which detects a position of the ejecting member 27 pressed down by the pressing cylinder 23 is provided in the cylinder tube 23a of the pressing cylinder 23. The position detection sensor 50 detects: a state in which the ejecting member 27 is positioned at a predetermined "residual 100% position" above the container 41 (FIG. 6A); and a state in which the ejecting member 27 is positioned at a predetermined "residual 0% position" serving as an example of a pressing-down limit position in the container 41 (FIG. 6B). The position detection sensor 50 further detects states in which the ejecting member 27 is positioned between the "residual 100% position" and the "residual 0% position" intermittently or continuously, for example, by a position of a piston. In the present embodiment, the position detection sensor 50 includes: a first sensor 51 which detects a state in which the ejecting member 27 is positioned at the "residual 100% position"; a second sensor 52 which detects a state in which the ejecting member 27 is positioned at a "residual 50% position" at which the ejection member 27 presses down the inner lid 42 such that a remaining amount of the paste Pst in the container 41 becomes half; a third sensor 53 which detect a state in which the ejecting member 27 is positioned at a "residual 25% position" at which the ejecting member 27 presses down the inner lid 42 such that the remaining amount of the paste Pst in the container 41 becomes one quarter; and a fourth sensor 54 which detects a state in which the ejecting member 27 is positioned at the "residual 0% position." Detection signals of the first sensor 51, the second sensor 52, the third sensor 53, and the fourth sensor 54 are input to the controller 28.

When the paste Pst is supplied by pressing down the inner lid 42 by the pressing cylinder 23, the position detection sensor 50 detects the position of the ejecting member 27 pressed down by the pressing cylinder 23. Based on the detected position of the ejecting member 27, the controller 28 generates a notification by displaying the remaining amount of the paste Pst in the container 41 on a display device 60 (FIG. 3) such as a touchscreen.

Specifically, as shown in FIG. 7, in a state in which the ejecting member 27 is positioned at the "residual 100% position" (FIG. 6A), the state of the first sensor 51 is ON, the states of the second sensor 52, the third sensor 53, and the fourth sensor 54 are OFF. The controller 28 recognize the state of the first sensor 51 as being ON and the states of the second sensor 52, the third sensor 53, and the fourth sensor 54 as being OFF, as they are. Based on the combination of the ON/OFF recognition states, the controller 28 determines that the ejecting member 27 is positioned at the "residual 100% position," and displays an indication of "residual 100%" on the display device 60. When the ejecting member 27 further moves down to a position lower than the "residual 100% position," the first sensor 51 is tuned OFF, but the controller 28 keeps the ON/OFF recognition state of the first sensor 51 as being ON, and maintains the indication of "residual 100%" on the display device 60.

In FIG. 7, when the ejecting member 27 reaches the "residual 50% position," the state of the second sensor 52 is changed from OFF to ON. As a result, the combination of ON/OFF recognition states is changed to a combination of ON/OFF recognition states of the first sensor 51 and the second sensor 52 as being ON and the third sensor 53 and the fourth sensor 54 as being OFF. Based on the changed combination, the controller 28 determines that the ejecting member 27 is positioned at the "residual 50% position," and display an indication of "residual 50%" on the display device 60. When the ejecting member 27 further moves down to a position lower than the "residual 50% position," the second sensor 52 turns OFF, but the controller 28 keeps the ON/OFF recognition state of the second sensor as being ON, and maintains the indication of "residual 50%" on the display device 60.

In FIG. 7, when the ejecting member 27 reaches the "residual 25% position," the state of the third sensor 53 is changed from OFF to ON. As a result, the combination of ON/OFF recognition states is changed to a combination of ON/OFF recognition states of the first sensor 51, the second sensor 52, and the third sensor 53 as being ON, and the fourth sensor 54 as being OFF. Based on the changed combination, the controller 28 determines that the ejecting member 27 is positioned at the "residual 25% position," and display an indication of "residual 25%" on the display device 60. When the ejecting member 27 further moves down to a position lower than the "residual 25% position," the third sensor 53 turns OFF, but the controller 28 keeps the ON/OFF recognition state of the third sensor 53 as being ON, and maintains the indication of "residual 25%" on the display device 60.

In FIG. 7, when the ejecting member 27 reaches the "residual 0% position" (FIG. 6B), the state of the fourth sensor 54 is changed from OFF to ON. As a result, the combination of ON/OFF recognition state is changed to a combination of ON/OFF recognition states of all of the first sensor 51, the second sensor 52, the third sensor 53, and the fourth sensor 54 as being ON. Based on the changed combination, the controller 28 determines that the ejecting member 27 is positioned at the "residual 0% position," and displays an indication of "residual 0%" on the display device 60. The indication of the remaining amount of the paste Pst in the container 41 displayed on the display device 60 may be represented by characters indicating, e.g., percentage, or may be represented by other indication such as illustration.

After the fourth sensor 54 detects a state in which the ejecting member 27 reaches the "residual 0% position" (i.e., the predetermined pressing-down limit position of the ejecting member 27 in the container 41) (FIG. 6B), the controller 28 controls the pressing cylinder 23 to continue to press down the ejecting member 27 for a time (ejection duration time) set in a timer 28T (FIG. 3) to eject the paste Pst remaining in the container 41. The time set in the timer 28T (ejection duration time) is set to a time for which the paste Pst remaining in the container 41 at a time point when the fourth sensor 54 detects the state in which the ejecting member 27 reaches the "residual 0% position" is sufficiently ejected from the through hole 41S. The ejection duration time set in timer 28T can be arbitrarily changed. For example, the ejection duration time may be set according to material of the paste Pst individually. Consequently, the necessary and sufficient ejection duration time can be set.

As described above, after the ejecting member 27 reaches the "residual 0% position," and then the pressing cylinder 23 continues to press down the ejecting member for the ejection duration time set in the timer 28T, the suction power generating mechanism 35 releases the holding (suction) of the inner lid 42 by the ejecting member 27, and then the pressing cylinder 23 performs the pulling operation to move the ejecting member 27 to the "residual 100% position." Consequently, the ejecting member 27 is pulled upward out from the container 41, whereby the operator OP can detach the container 41 from the pot insertion hole 22H and exchange the paste pot 40 for a new one. Since the inner lid 42 of the sued paste pot 40 remains in the container 41, the operator OP can dispose of the container 41 together with the inner lid 42. When the pressing cylinder 23 moves the ejecting member 27 to the "residual 100% position," the controller 28 resets the signal recognition states of the first sensor 51, the second sensor 52, the third sensor 53, and the fourth sensor 54, so as to prepare for the detection of residual amount of paste Pst in the next (new) paste pot 40.

Next, an execution procedure of the screen printing work (screen printing method) by the screen printing machine 1 is described. In the screen printing work using the screen printing machine 1, at first, the controller 28 controls the paste supply apparatus 4 to ejects and supply the paste Pst on the mask 2 as described above (a paste supply process). During the paste supply process, the controller 28 controls the belt driving mechanism 24 to cause the paste supply apparatus 4 to reciprocate along the X-axis direction. Consequently, the paste Pst is supplied to spread in the direction in which the squeegee 13 extends.

After the paste supply apparatus 4 supplies the Pst on the mask 2, a board moving mechanism (not shown) causes the board to contact (or to be placed close to) the lower surface of the mask 2. When the board contacts (or is placed close to) the mask 2, the squeegee lifting mechanism 12 moves down one of the squeegees 13 such that the lower end of the squeegee 13 abuts on the mask 2. Thereafter, the head moving mechanism (not shown) described above moves the print head 3 along the Y-axis direction such that the squeegee 13 slides on the mask 2, and the paste Pst is printed on the electrodes of the board via the pattern holes of the mask 2 (printing process). After completion of the printing process, the board moving mechanism moves the board to be separate from the mask 2. Consequently, the screen printing for one sheet of the board is finished.

As describe above, the screen printing machine 1 of the present embodiment includes a detector (the fourth sensor 54) which detects the state in which the ejecting member 27 reaches the predetermined pressing-down limit position (the "residual 0% position") in the container 41, and after the fourth sensor 54 detects the state in which the ejecting member 27 reaches the pressing-down limit position in the container 41, the pressing cylinder 23 continues to press down the ejecting member 27 to further eject the paste Pst in the container 41. Consequently, even when the paste Pst is not completely ejected from the container 41 at the time point at which the ejecting member 27 reaches the pressing-down limit position in the container 41, the not-ejected paste Pst can be further ejected, whereby the paste Pst remaining in the container 41 can be reduced. Therefore, waste of the paste Pst generated by remaining in the container 41 can be reduced.

According to one or more embodiments of the present invention, it is possible to provide to provide a screen printing machine and a screen printing method which can reduce waste paste generated by remaining in a container.

What is claimed is:

1. A screen printing machine comprising:
   a mask;
   a paste supply apparatus which supplies paste on the mask by using a paste pot comprising a tubular container which stores the paste and which comprises a bottom portion having a through hole and an inner lid movable in the container;
   a squeegee slidable on the mask on which the paste is supplied by the paste supply apparatus,
   wherein the paste supply apparatus comprises:
      a pot holder which holds the paste pot such that the through hole faces downward;
      an ejecting member which abuts on the inner lid of the paste pot held by the pot holder;
      an ejecting member lifting unit which presses down the ejecting member abutting on the inner lid in the container to eject the paste from the through hole;
      a detector which detects a state in which the ejecting member reaches a predetermined press-down limit position in the container; and
      a timer for setting a time during which the ejecting member lifting unit continues to press down the ejecting member to further eject the paste in the container after the detector detects the state in which the ejecting member reaches the press-down limit position in the container, and
   wherein after the detector detects the state in which the ejecting member reaches the press-down limit position in the container, the ejecting member lifting unit continues to press down the ejecting member to further eject the paste in the container.

2. The screen printing machine according to claim 1, wherein the time set in the timer is arbitrarily changeable.

3. A screen printing method by a screen printing machine, the screen printing machine comprising:
   a mask;
   a paste supply apparatus which supplies paste by using a paste pot comprising a tubular container which stores the paste and which comprises a bottom portion having a through hole and an inner lid movable in the container; and
   a squeegee slidable on the mask,
   wherein the paste supply apparatus comprises:
      a pot holder which holds the paste pot such that the through hole faces downward;
      an ejecting member which abuts on the inner lid of the paste pot held by the pot holder;
      an ejecting member lifting unit which presses down the ejecting member abutting on the inner lid in the container to eject the paste from the through hole;
      a detector which detects a state in which the ejecting member reaches a predetermined press-down limit position in the container; and
      a timer for setting a time during which the ejecting member lifting unit continues to press down the ejecting member to further eject the paste in the container after the detector detects the state in which the ejecting member reaches the press-down limit position in the container, and
   said screen printing method comprising:
   supplying the paste on the mask by ejecting the paste from the through hole by pressing down an ejecting member in the container during the time set by the timer, the ejecting member abutting on the inner lid of the paste pot held in a state in which the through hole faces downward; and
   printing the paste on a board via the mask by moving the squeegee to slide on the mask on which the ejected paste is supplied,
   wherein during the supply of the paste, after the ejecting member reaches a predetermined press-down limit position in the container, pressing down of the ejecting member is continued to further eject the paste in the container.

* * * * *